US012234544B2

(12) United States Patent
Murata et al.

(10) Patent No.: US 12,234,544 B2
(45) Date of Patent: Feb. 25, 2025

(54) SPUTTERING TARGET AND METHOD FOR PRODUCING SPUTTERING TARGET

(71) Applicant: JX Advanced Metals Corporation, Tokyo (JP)

(72) Inventors: Shuhei Murata, Ibaraki (JP); Masaya Iwabuchi, Ibaraki (JP); Yusuke Sato, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 0 days.

(21) Appl. No.: 18/026,437

(22) PCT Filed: Jun. 10, 2022

(86) PCT No.: PCT/JP2022/023495
§ 371 (c)(1),
(2) Date: Mar. 15, 2023

(87) PCT Pub. No.: WO2023/017667
PCT Pub. Date: Feb. 16, 2023

(65) Prior Publication Data
US 2024/0026525 A1    Jan. 25, 2024

(30) Foreign Application Priority Data
Aug. 11, 2021   (JP) .................................. 2021-131384

(51) Int. Cl.
*C23C 14/34*      (2006.01)
*B23K 20/02*      (2006.01)
(Continued)

(52) U.S. Cl.
CPC .......... *C23C 14/3414* (2013.01); *B23K 20/02* (2013.01); *B23K 20/023* (2013.01);
(Continued)

(58) Field of Classification Search
CPC . C23C 14/3414; C23C 14/3407; C23C 14/34; B23K 20/02; B23K 20/023;
(Continued)

(56) References Cited

U.S. PATENT DOCUMENTS 5,693,203 A    12/1997  Ohhashi et al.
5,993,621 A    11/1999  Liu
(Continued)

FOREIGN PATENT DOCUMENTS

CN    107614744 A    1/2018
CN    109804096 A    5/2019
(Continued)

OTHER PUBLICATIONS

Machine Translation 11-236665 (Year: 1999).*
(Continued)

*Primary Examiner* — Rodney G McDonald
(74) *Attorney, Agent, or Firm* — MARSHALL, GERSTEIN & BORUN LLP

(57) ABSTRACT

A sputtering target comprised of a plurality of members including a target material and a base material, wherein the plurality of members includes a first member and a second member laminated to each other, wherein the first member contains Al, and the second member contains Cu, wherein at least one of the first member and the second member contains Mg, wherein the sputtering target includes an alloy layer containing Al and Cu between the first member and the second member, the alloy layer being in contact with the first member and the second member, and wherein the alloy layer further includes an Mg-containing layer containing 5.0 at % or more of Mg in at least a part of the alloy layer.

16 Claims, 10 Drawing Sheets

(51) Int. Cl.
  *C22C 9/06* (2006.01)
  *C22C 21/06* (2006.01)
  *H01J 37/34* (2006.01)
  *B23K 101/34* (2006.01)
  *B23K 103/18* (2006.01)

(52) U.S. Cl.
  CPC ............... *C22C 9/06* (2013.01); *C22C 21/06* (2013.01); *H01J 37/3429* (2013.01); *B23K 2101/34* (2018.08); *B23K 2103/18* (2018.08)

(58) Field of Classification Search
  CPC .. B23K 2101/34; B23K 2103/18; C22C 9/06; C22C 21/06; H01J 37/3429; H01J 37/3426
  USPC ........................................ 204/298.12, 298.13
  See application file for complete search history.

(56) References Cited

U.S. PATENT DOCUMENTS

| | | | |
|---|---|---|---|
| 6,106,960 | A | 8/2000 | Fujii et al. |
| 6,645,427 | B1 | 11/2003 | Kardokus et al. |
| 6,755,948 | B1 | 6/2004 | Fukuyo et al. |
| 6,793,124 | B1 | 9/2004 | Takahashi et al. |
| 10,844,475 | B2 | 11/2020 | Irumata et al. |
| 10,900,102 | B2 | 1/2021 | Ferrasse et al. |
| 11,244,814 | B2 | 2/2022 | Takigawa |
| 2009/0078570 | A1 | 3/2009 | Yi et al. |
| 2018/0094340 | A1 | 4/2018 | Ferrasse et al. |
| 2018/0127866 | A1 | 5/2018 | Irumata et al. |
| 2022/0098723 | A1 | 3/2022 | Kaminaga et al. |

FOREIGN PATENT DOCUMENTS

| | | | |
|---|---|---|---|
| JP | H06-172993 | A | 6/1994 |
| JP | H11-77365 | A | 3/1999 |
| JP | 11-236665 | * | 8/1999 |
| JP | H11-236665 | A | 8/1999 |
| JP | 2001-509548 | A | 7/2001 |
| JP | 2002-105635 | A | 4/2002 |
| JP | 2002-294437 | A | 10/2002 |
| JP | 2003-500546 | A | 1/2003 |
| JP | 2010-235998 | A | 10/2010 |
| KR | 0162969 | B1 | 11/1998 |
| TW | 201812060 | A | 4/2018 |
| WO | WO-99/02750 | A1 | 1/1999 |
| WO | WO-00/73531 | A2 | 12/2000 |
| WO | WO-01/38598 | A1 | 5/2001 |
| WO | WO-2020/195030 | A1 | 10/2020 |

OTHER PUBLICATIONS

International Preliminary Report on Patentability and Written Opinion in International Application No. PCT/JP2022/023495 dated Feb. 22, 2024, 5 pages.
Search Report in International Application No. PCT/JP2022/023495 dated Aug. 9, 2022, 4 pages.
Office Action in TW Application No. 111121660, 14 pages.
Office Action in JP Application No. 2023-501674 dated Jun. 4, 2024, 8 pages.
Office Action in KR Application No. 10-2023-7004384 dated Dec. 10, 2024, 15 pages.

* cited by examiner

SPUTTERING TARGET AND METHOD FOR PRODUCING SPUTTERING TARGET

CROSS-REFERENCE TO RELATED APPLICATION

This is the US national phase application of International patent application No. PCT/JP2022/023495 filed Jun. 10, 2022, which claims the priority benefit of Japanese Patent Application No. 2021-131384 filed on Aug. 11, 2021, the entire respective disclosures of which are incorporated herein by reference.

FIELD OF THE INVENTION

This specification discloses a technique relating to a sputtering target and a method for producing the sputtering target.

BACKGROUND OF THE INVENTION

In recent years, with dramatic progress of semiconductor-related technologies, there is a trend toward higher integration of semiconductors and miniaturization of electronic devices equipped with semiconductor chips. Under such circumstances, the production of electronic devices or the like performs the formation of a large number of thin films by sputtering using various sputtering targets. Such thin films include, for example, thin films such as titanium or titanium alloy films, titanium silicide films, and titanium nitride films, and in the sputtering, a sputtering target having a target material made of titanium or the like according to the material of the thin film is used.

The thin film is formed by sputtering, for example, as follows. First, a high voltage is applied between a substrate and the sputtering target in vacuum while introducing an inert gas such as an Ar gas. Then, ions such as ionized Ar are allowed to collide with the target material of the sputtering target. The collision energy ejects atoms in the target material and deposits them on the substrate. This can lead to the formation of the thin film on the substrate. The sputtering targets may be flat plate-shaped or cylindrical-shaped, and generally include a target material and a base material superimposed onto and bonded to the target material.

Such techniques are described in Patent Literatures 1 to 5, for example, as those relating to target materials mainly containing titanium.

CITATION LIST

Patent Literatures

[Patent Literature 1] WO 01/38598 Al
[Patent Literature 2] U.S. Pat. No. 6,755,948 B1
[Patent Literature 3] Japanese Patent Application Publication No. 2001-509548 A
[Patent Literature 4] U.S. Pat. No. 5,993,621 B1
[Patent Literature 5] Japanese Patent Application Publication No. 2010-235998 A

SUMMARY OF THE INVENTION

Technical Problem

In the sputtering target composed of a plurality of members including the target material and the base material, a first member and a second member to be laminated to each other may not be sufficiently firmly bonded to each other. In this case, there is a concern that warpage fluctuations due to thermal expansion during sputtering and shrinkage during cooling may cause peeling at the bonding interface, affecting the sputtering process.

This specification discloses a sputtering target capable of firmly bonding a first member and a second member laminated to each other in the sputtering target, and a method for producing the sputtering target.

Solution to Problem

The sputtering target disclosed in this specification is a sputtering target comprising a plurality of members including a target material and a base material, wherein the plurality of members comprise a first member and a second member laminated to each other, wherein the first member comprises Al, and the second member comprises Cu, wherein at least one of the first member and the second member comprises Mg, wherein the sputtering target comprises an alloy layer containing Al and Cu between the first member and the second member, the alloy layer being in contact with the first member and the second member, and wherein the alloy layer further comprises an Mg-containing layer containing 5.0 at % or more of Mg in at least a part of the alloy layer.

Further, the method for producing the sputtering target disclosed in this specification is a method for producing a sputtering target comprising a plurality of members including a target material and a base material, the method comprising: a preparation step of preparing the plurality of members, the plurality of members comprising a first member and a second member laminated to each other, the first member comprising Al and the second member comprising Cu, at least one of the first member and the second member comprising Mg; and a bonding step of bonding the plurality of members comprising the first member and the second member under pressure while laminating the plurality of members.

Advantageous Effects of Invention

According to the sputtering target and the method for producing the sputtering target as described above, the first member and second member laminated to each other in the sputtering target can be firmly bonded to each other.

DETAILED DESCRIPTION OF THE INVENTION

Figure 1:
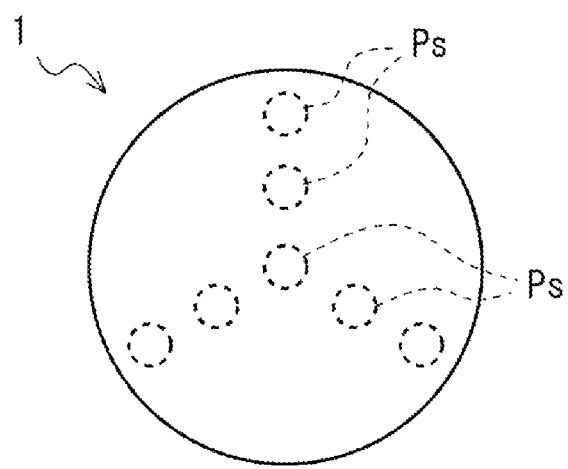
FIG. 1 is a plane view of a sputtering target, showing sample collecting positions for measuring a bonding strength between an insert material and a base material.
Figure 2:
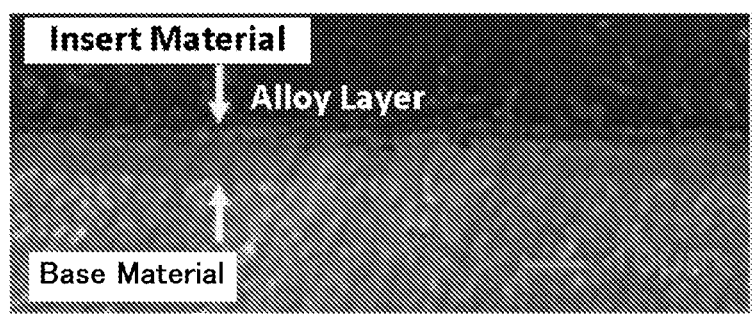
FIG. 2 is a SEM image of a cross section in a thickness direction of a sputtering target according to Example 1.
Figure 3:
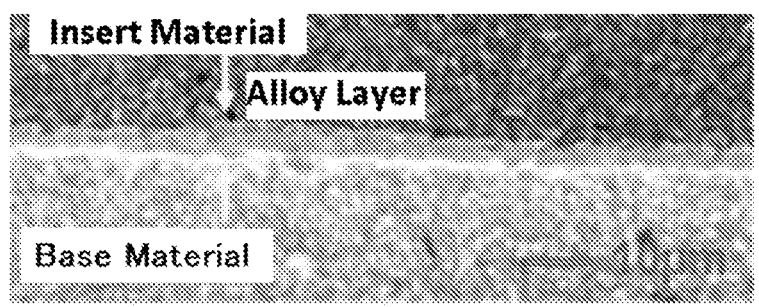
FIG. 3 is a SEM image of a cross section in a thickness direction of a sputtering target according to Example 2.
Figure 4:
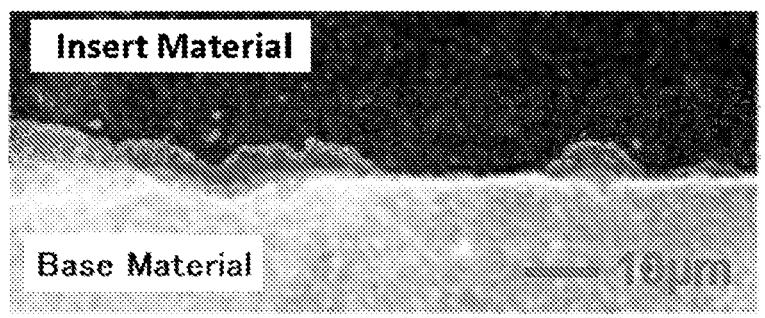
FIG. 4 is a SEM image of a cross section in a thickness direction of a sputtering target according to Comparative Example 1.
Figure 5:
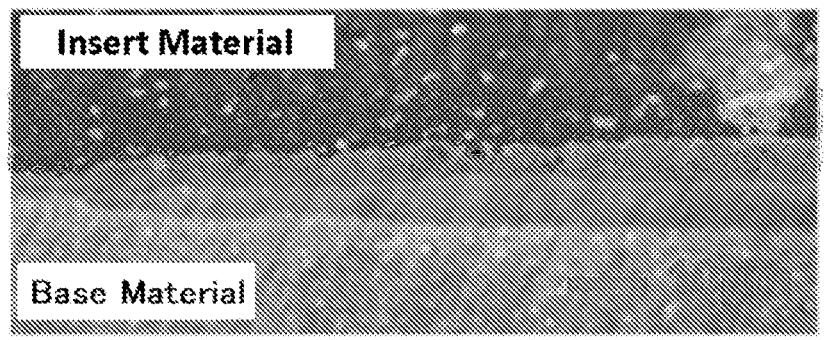
FIG. 5 is a SEM image of a cross section in a thickness direction of a sputtering target according to Comparative Example 2.

Embodiments of the sputtering target and the method for producing the sputtering target as described above will be described in detail below.

A sputtering target according to an embodiment is composed of a plurality of members including a target material and a base material. The plurality of members includes a first member and a second member laminated to each other, the first member contains Al, the second member contains Cu, and at least one of the first member and the second member contains Mg. The sputtering target includes an alloy layer containing Al and Cu between the first member and the second member, the alloy layer being in contact with the first member and the second member. The alloy layer further includes a Mg-containing layer containing 5.0 at % or more of Mg in at least a part of the alloy layer. Hereinafter, for convenience of explanation, among the members of the sputtering target, which are laminated to each other, one member containing Al is referred to as the first member, and the other member containing Cu is referred to as the second member.

In the sputtering target in which the target material and the base material are laminated, one of the target material and the base material may be the first member containing Al, and the other may be the second member containing Cu. Also, in the sputtering target in which the target material, the insert material, and the base material are laminated in this order, the target material may be the first member containing Al, and the insert material may be the second member containing Cu, or the insert material may be the first member containing Al, and the base material may be the second member containing Cu.

It has been found that the bonding strength of such a first member containing Al and such a second member containing Cu becomes lower even if they are directly laminated and bonded together. It is believed that this is because Cu and Al form fragile intermetallic compounds (CuAl, $CuAl_2$, etc.) due to interdiffusion of Cu and Al at an interface between the first member and the second member. If the bonding strength between the first member and the second member is lower, the first member and the second member may peel off at the bonding interface due to thermal expansion during sputtering and shrinkage during cooling.

On the other hand, this embodiment has the alloy layer which contains Al and Cu between the first member and the second member and which is in contact with the first member and the second member, wherein the alloy layer further includes an Mg-containing layer containing 5.0 at % or more of Mg in addition to Al and Cu, in at least a part of the alloy layer. This results in firm bonding of the first member and the second member. Thus, it is supposed that in the Mg-containing layer in at least a part of the alloy layer, the formation of the intermetallic compounds of Cu and Al is suppressed by containing Mg together with Cu and Al, and a stronger alloy of Al, Cu and Mg is formed. However, it is not limited to such a theory, and there may be the Mg-containing layer having a portion where Al, Cu and Mg are contained and the Mg content is 5.0 at % or more in at least a part of the alloy layer containing Al and Cu between the first member and the second member.

Here, detailed descriptions are mainly made for examples of a sputtering target in which the target material, the insert material, and the base material are laminated in this order, in which the first member is the insert material and the second member is the base material, and in which the first member is the base material and the second member is the insert member. Further, one of the first member and the second member may be the target material, and the other may be the insert material, although detailed descriptions are omitted. Furthermore, a sputtering target that does not contain the insert material can also be intended. For example, the first member may be the target material and the second member may be the base material, or the first member may be the base material and the second member may be the target material.

(Target Material)

The target material has a sputtering surface subjected to sputtering, and generally has a shape such as a disk shape or other flat plate shape, or a cylindrical shape.

The material of the target material is appropriately determined according to the material of the thin film formed on the substrate or the like by sputtering. If the insert material contains Al, the target material can be made of a material that can be bonded to the Al-containing insert material, such as Ti, Ta, Cu, Cu alloys, W, WSi, Co, Al, and the like.

Among others, the target material typically contains Ti. In this case, the target material can be made of pure Ti containing mainly Ti. The target material made of pure Ti typically has a Ti content of 99.995% by mass or more, but the Ti content may be 99.999% by mass or more, or even 99.9995% by mass or more. The pure Ti target material may contain at least one impurity selected from the group consisting of Al, Fe, Ni and Cu.

Alternatively, the target material can be made of a Ti alloy containing Ti and Al. In the case of such a Ti alloy target material, the Al content may be, for example, 30 at % to 70 at %, or it may be about 50 at % as an example.

(Base Material)

The base material has a shape such as a flat plate shape or a cylindrical shape corresponding to that of the target material, and is arranged on the back surface side opposite to the sputtering surface of the target material, and may also be called a backing plate or a backing tube. In this embodiment, the base material is arranged so that an insert material which will be described later, is sandwiched between said base material and the target material. That is, the sputtering target according to this embodiment is obtained by laminating the target material, the insert material, and the base material in this order.

When the insert material as described later is the first member containing Al, the base material is the second member containing Cu. Alternatively, when the insert material is the second member containing Cu, the base material is the first member containing Al. Typically, the insert material is the first member containing Al and the base material is the second member containing Cu.

More particularly, when the base material is the second member, it may be made of pure Cu containing mainly Cu. Alternatively, when the base material is the first member, it may be made of pure Al containing mainly Al.

Alternatively, if the base material is the second member, it can be made of a Cu alloy containing Cu and Mg. Alternatively, if the base material is the first member, it can be made of an Al alloy containing Al and Mg. The Al alloy may contain Si, Mn, Cr, Zn, and the like, in addition to Mg. In a certain embodiment, the base material is free of Mg and the insert material further contains Mg. However, both the base material and the insert material may contain Mg.

In particular, the base material is preferably made of the Cu alloy or Al alloy containing Mg. In this case, the Mg content in the base material is preferably 1.0% by mass to 10.0% by mass, and more preferably 3.4% by mass or more. If the Mg content in the base material is too low, it will be difficult to form the alloy layer including a Mg-containing layer containing Al, Cu and Mg between the base material and the insert material, so that there is concern that a required bonding strength between the base material and the insert material may not be ensured. If the Mg content in the base material is too high, properties originally required for the Mg-containing base material may be impaired.

(Insert Material)

The insert material may be interposed between the target material and the base material. The insert material may be provided for the purpose of performing intermetallic diffusion bonding in order to improve the bonding strength between the target material and the base material. Also, the insert material has a function of, for example, alleviating warpage of the sputtering target and absorbing strain during sputtering.

As described above, when the base material is the second member and contains Cu, the insert material is the first member and contains Al. Alternatively, when the base material is the first member and contains Al, the insert material is the second member and contains Cu.

More particularly, when the insert material is the first member, it may be made of pure Al containing mainly Al. Alternatively, when the insert material is the second member, it may be made of pure Cu containing mainly Cu.

Alternatively, when the insert material is the first member, it can be made of an Al alloy containing Al and Mg. The Al alloy may contain Si, Mn, Cr, Zn, and the like, in addition to Mg. Alternatively, when the insert material is the second member, it can be made of a Cu alloy containing Cu and Mg.

In particular, the insert material is preferably made of an Al alloy or Cu alloy containing Mg. In this case, the Mg content in the insert material is preferably 1.0% by mass to 10.0% by mass, and more preferably 3.4% by mass or more. When the Mg content in the insert material is too low, it will be difficult to form the alloy layer including the Mg-containing layer containing Al, Cu and Mg between the insert material and the base material, so that there is concern that a required bonding strength between the base material and the insert material may not be ensured. If the Mg content in the insert material is too high, properties originally required for the insert material containing Mg may be impaired.

(Alloy Layer)

The alloy layer containing at least Al and Cu is present between the first member such as the insert material and the second member such as the base material, and the Mg-containing layer containing the three elements of Al, Cu and Mg is contained in at least a part of the alloy layer. The Mg-containing layer contains 5.0 at % or more of Mg. The Mg-containing layer firmly bonds the first member to the second member. The alloy layer may include, in addition to the Mg-containing layer, a layer containing Al and Cu but not containing Mg. Even if there is a layer that does not contain Mg in the alloy layer, the presence of the Mg-containing layer allows a strong alloy of the three elements to be formed there, so that the bonding strength between the first member and the second member can be improved. However, if there is a portion containing both Al and Cu, an intermetallic compound of Al and Cu may be formed in that portion. Therefore, it is preferable that the Mg-containing layer is formed over a relatively wide range in the alloy layer.

By performing SEM-EDX (energy dispersive X-ray analysis) on a cross section in a thickness direction perpendicular to the sputtering surface of the target material of the sputtering target, the alloy layer and the Mg-containing layer can be confirmed, and each content of the three elements can be measured.

When SEM-EDX LineScan is performed along the thickness direction of the cross section of the sputtering target in the thickness direction, the alloy layer means a portion where each content of Al and Cu is 5.0 at % or more in an element ratio on that Line, between the first member and the second member. The alloy layer is between a position on a side of the first member where both Al and Cu are 5.0 at % or more and a position on a side of the second member where both Al and Cu are 5.0 at % or more. If the content of Al or Cu does not decrease to less than 5.0 at % when the content of Al or Cu is confirmed from the alloy layer to the first member or the second member near the interface between the alloy layer and the first member or the second member, a position where that content converges to a constant value is defined as the interface position between the alloy layer and the first member or the second member.

The Mg-containing layer is a portion where the three elements of Al, Cu and Mg are contained in the above alloy layer and the Mg content is 5.0 at % or more. The presence or absence of the Mg-containing layer can also be confirmed by performing a SEM-EDX LineScan along the thickness direction of the cross section in the thickness direction of the sputtering target. Even if there is a portion containing the three elements of Al, Cu and Mg in the alloy layer, that portion is not regarded as the Mg-containing layer if the Mg content is less than 5.0 at % at any point in the portion. The conditions for the SEM-EDX Line Scan are: magnifications of 1000 to 2000 times; a distance between an objective lens and a sample (WD: Working Distance) of 10 mm; and a scanning distance of 30 μm to 50 μm.

The alloy layer preferably has a thickness of 5 μm to 20 μm, and more preferably 10 μm to 15 μm. If the thickness of the alloy layer is too thin, there is a concern that the effect of improving the bonding strength by the Mg-containing layer may not be sufficiently obtained, resulting in a decrease in the bonding strength. On the other hand, if the thickness of the alloy layer is too thick, the bonding strength of the intermetallic compound layer of Cu and Al becomes dominant, and the bonding strength may decrease. The above thickness of the alloy layer means a distance between a position where the contents of both Al and Cu are 5.0 at % or more on the first member side and a position where the contents of both Al and Cu are 5.0 at % or more on the second member side in the thickness direction, when performing the SEM-EDX LineScan on the cross section in the thickness direction through the center of the sputtering target in the radial direction.

When performing the SEM-EDX LineScan along the thickness direction of the sputtering target, the thickness of the Mg-containing layer is preferably 20% or more of the thickness of the alloy layer. This can lead to significant improvement of the bonding strength.

The Mg-containing layer is preferably formed over a relatively large area between the first member and the second member. When observing the cross section in the thickness direction through the center of the sputtering target in a plane view (which is a center of a circle in the radial direction because if the sputtering target is disk-shaped, the plane view of the sputtering target as viewed from the sputtering surface side is circular), the Mg-containing layer is preferably formed at a percentage of 50% or more of the entire width of the first member and the second member along the direction orthogonal to the thickness direction of the cross section. The width of the first member and the second member as used herein means a length of a region in the cross section along the thickness direction where the first member and the second member overlap with each other, in the direction orthogonal to the thickness direction. When the Mg-containing layer is present in such a relatively large percentage in the direction perpendicular to the thickness direction, the bonding strength can be further improved. A part of the region where the first member and the second member overlap with each other may have a portion where the Mg-containing layer is not present.

The alloy layer and the Mg-containing layer are preferably formed by diffusion bonding of the first member and the second member. In such cases, the Al content in the alloy layer may be lower in the portion in contact with the second member than in the portion in contact with the first member. Also, in the alloy layer, the Cu content may be lower in the portion in contact with the first member than in the portion in contact with the second member.

(Bonding Strength)

The bonding strength between the insert material (first member) and the base material (second member) is more preferably 5 kgf/mm$^2$ or more, and more preferably 10 kgf/mm$^2$. If the bonding strength between the insert material and the base material is too low, thermal expansion occurs during sputtering, and shrinkage during cooling may cause peeling at the bonding interface via the alloy layer. Although there is no particular problem due to excessively high bonding strength, it may be 15 kgf/mm$^2$ or less.

The bonding strength between the insert material and the base material is measured as follows. First, from the sputtering target including the target material, the insert material and the base material, a sample including each portion of the target material, the insert material and the base material is collected in the thickness direction. In a sputtering target 1 having a circular shape as viewed in a plane as shown in FIG. 1, seven points in total: one point at the center as viewed in the plane; three points spaced at equal intervals in the circumferential direction on the outer peripheral side; and three points at the center in the radial direction between the points at the center and the points on the outer peripheral side are defined as sample collecting points Ps.

Subsequently, each sample is subjected to a uniaxial tensile test in the thickness direction using a tensile tester. Then, the strength when the portion corresponding to the insert material and the portion corresponding to the base material in the sample are peeled off is measured. An average value of the strengths in the respective samples is defined as the bonding strength.

(Production Method)

The sputtering target as described above can be produced, for example, as described below.

First, as a preparation step, a plurality of members including a first member and a second member are prepared. The first member contains Al, the second member contains Cu, and at least one of the first member and the second member is made of an alloy containing Mg.

When producing the sputtering target in which the target material, the insert material, and the base material are laminated in this order, the target material, the insert material, and the base material as described above are prepared, respectively. In this embodiment, one of the insert material or the base material is used as the first member as described above, and the other is used as the second member as described above.

As previously described, typically, the insert material is the first member containing Al and the base material is the second member containing Cu. Also, typically, the base material does not contain Mg, and the insert material further contains Mg. In a certain embodiment, the insert material is an Al alloy containing Mg. The target material may contain Ti, for example.

Subsequently, a bonding step is performed in which the plurality of members including the first member and the second member are bonded under pressure while laminating the plurality of members. In this embodiment, the target material, the insert material, and the base material are laminated in this order, and in the laminated state, they are pressurized in the thickness direction and bonded together. At this time, as described above, the Mg diffuses from the first member and/or the second member containing Mg to the interface between the first member and the second member, and Al and Cu contained in the first member and/or the second member also diffuse at the interface. Thus, the alloy layer containing at least Al and Cu is formed at the interface between the insert material and the base material, and the Mg-containing layer containing 5.0 at % or more of Mg is further formed in the alloy layer. Since the Mg-containing layer containing the three elements Al, Cu, and Mg in the alloy layer has higher strength, the formation of the Mg-containing layer at the interface between the first member and the second member results in firm bonding of the first member and the second member. Here, the insert material which is one of the first member or the second member, and the base material which is the other are firmly bonded to each other.

The bonding step can be performed by hot isostatic pressing (HIP), hot pressing or cold isostatic pressing (CIP) or various other methods, but the hot isostatic pressing is preferable from the view point that the entire interface can be effectively diffusion-bonded because the hot isostatic pressing applies isotropic pressure (hydrostatic pressure) while heating at a relatively high temperature.

After the bonding step, a sputtering target is obtained in which the target material, the insert material and the base material are laminated in this order. In this sputtering target, the alloy layer including the Mg-containing layer containing Al, Cu and Mg is formed at least partially between the insert material and the base material, so that the insert material and the substrate are bonded with a required strength.

EXAMPLES

Next, the sputtering targets according to present invention were experimentally produced and their effects were confirmed as described below. However, the description herein is merely for the purpose of illustration and is not intended to be limited thereto.

Target materials made of pure Ti, insert materials, and base materials were prepared.

Example 1 prepared the base material made of a Cu—Ni—Si alloy containing 1.8 to 3.0% by mass of Ni, and 0.4 to 0.8% by mass of Si, the balance being Cu, and also prepared the insert material made of an Mg-containing Al alloy containing about 4.0 to 4.9% by mass of Mg, about 0.05 to 0.25% by mass of Cr, about 0.4 to 1.0% by mass of Mn, the balance being Al. Then, the target material, the insert material and the base material were laminated in this order, and hot isostatic pressing (HIP) was performed. A sputtering target was thus produced.

In Example 2, a sputtering target was produced by the same method as that of Example 1, with the exception that it used the insert material made of an Mg-containing Al alloy containing about 2.2 to 2.8% by mass of Mg, and 0.15 to 0.35% by mass of Cr, the balance being Al.

In Example 3, a sputtering target was produced by the same method as that of Example 1, with the exception that a temperature of the HIP was increased and a time of the HIP was increased.

In Comparative Example 1, a sputtering target was produced by the same method as that of Example 1, with the exception that it used the insert material made of pure Al mainly composed of Al.

In Comparative Example 2, a sputtering target was produced by the same method as that of Example 1, with the exception that it used the insert material made of a Cu-containing Al alloy containing about 3.5 to 4.5% by mass of Cu, about 0.4 to 0.8% by mass of Mg, about 0.2 to 0.8% by mass of Si, and about 0.4 to 0.8% by mass of Mn, the balance being Al.

The cross section in the thickness direction of the sputtering target according to each of Examples 1 and 2 and Comparative Examples 1 and 2 was observed by SEM-EDX. The images are shown in FIGS. 2 to 5. It is considered from FIGS. 2 and 3 that the alloy layer containing Al and Cu was formed at the interface between the target material and the base material.

Further, the cross section in the thickness direction of the sputtering target according to each of Examples 1 to 3 and Comparative Examples 1 and 2 was subjected to LineScan by EDX. The LineScan was performed for a sample collected from a position of ½R (a half position of a radius R, a position at the center of the radius) of the cross section in the thickness direction through the center of the sputtering target in the radial direction. The results are shown in FIGS. 6 to 10. In each of the graphs shown in FIGS. 6 to 10, the horizontal axis is the number of measurement points, and the vertical axis is the element ratio (at %).

Figure 6:
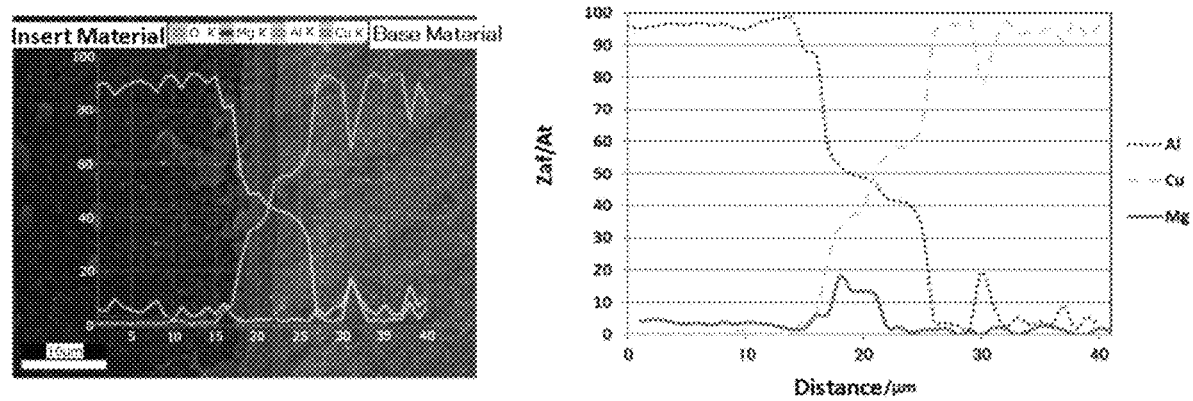
FIG. 6 is an SEM image showing a scanning range of a cross section in a thickness direction of a sputtering target according to Example 1, obtained by EDX LineScan, and a graph showing variations in a content of each element.
Figure 7:
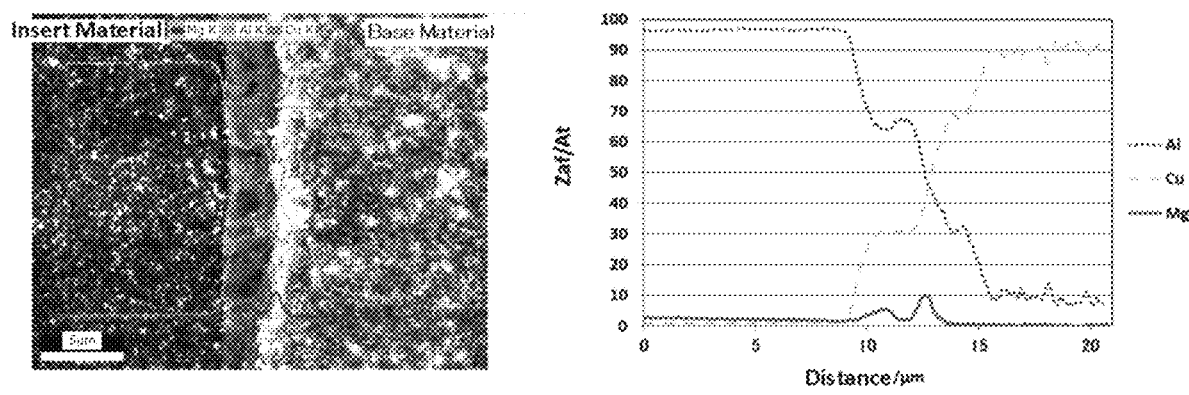
FIG. 7 is an SEM image showing a scanning range of a cross section in a thickness direction of a sputtering target according to Example 2, obtained by EDX LineScan, and a graph showing variations in a content of each element.
Figure 8:
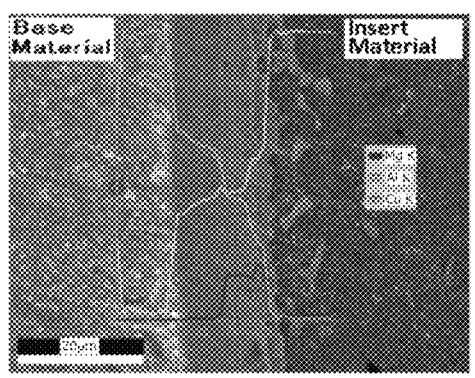
FIG. 8 is an SEM image showing a scanning range of a cross section in a thickness direction of a sputtering target according to Example 3, obtained by EDX LineScan, and a graph showing variations in a content of each element.
Figure 8:
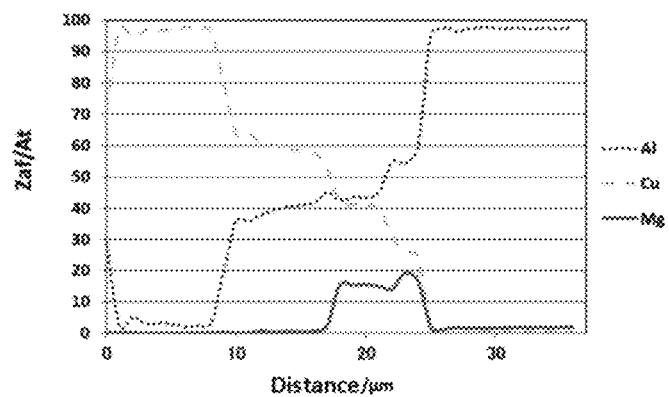
Figure 9:
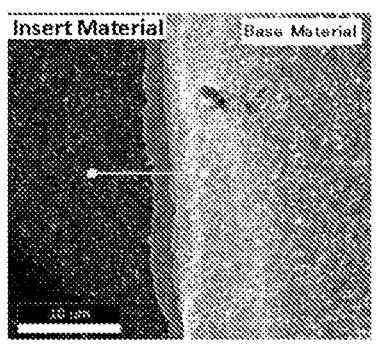
FIG. 9 is an SEM image showing a scanning range of a cross section in a thickness direction of a sputtering target according to Comparative Example 1, obtained by EDX LineScan, and a graph showing variations in a content of each element.
Figure 9:
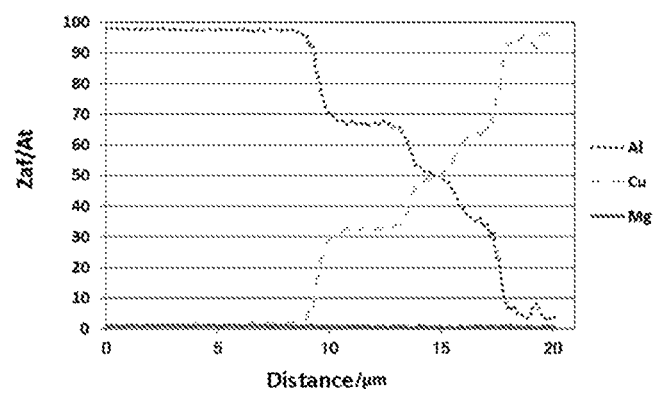
Figure 10:
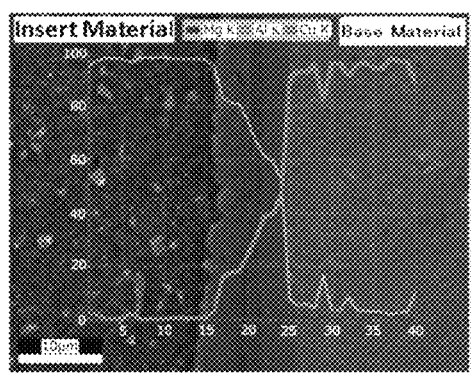
FIG. 10 is an SEM image showing a scanning range of a cross section in a thickness direction of a sputtering target according to Comparative Example 2, obtained by EDX LineScan, and a graph showing variations in a content of each element.
Figure 10:
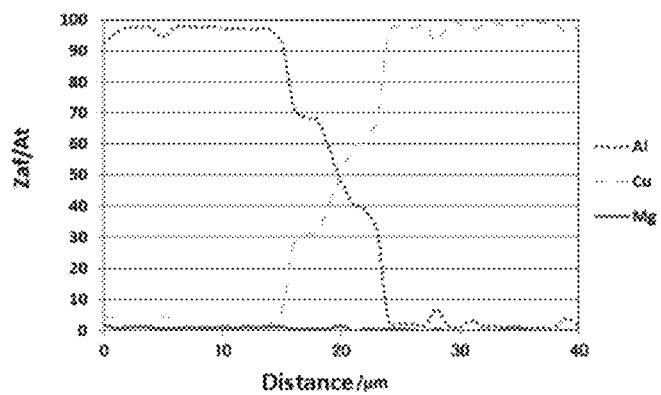

It is found from FIGS. 6 to 8 that, in each of the sputtering targets according to Examples 1 to 3, the Mg-containing layer containing Al, Cu and Mg and at least a portion of which has a Mg content of 5.0 at % or more is included in the alloy layer. In Example 1 shown in FIG. 6, the thickness of the alloy layer was about 10 μm, and the thickness of the Mg-containing layer was about 4 μm. Moreover, in Example 2 shown in FIG. 7, the thickness of the alloy layer was about 7.63 μm, and the thickness of the Mg-containing layer was about 1.55 μm. In Example 3, the thickness of the alloy layer was about 15 μm, and the thickness of the Mg-containing layer was about 7 μm. In each of Examples 1 to 3, the thickness of the Mg-containing layer was 20% or more of the thickness of the alloy layer. In Example 2 (FIG. 7), the Al content in the alloy layer on the base material side did not decrease to less than 5.0 at %, but the Al content converged to a constant value (about 10 at %), and it is recognized that the position where the convergence starts is the interface position between the alloy layer and the base material.

On the other hand, in each of the sputtering target according to Comparative Examples 1 and 2, although Mg is contained in the alloy layer, the Mg content is less than 5.0 at %, which means that there is no Mg-containing layer.

In addition, for each of the sputtering targets according to Examples 1 to 3 and Comparative Examples 1 and 2 described above, the bonding strength was measured using a tensile tester (precision universal testing machine (Autograph) AG-100 kNX plus from Shimadzu Corporation) based on the method described above. The results are shown in Table 1.

TABLE 1

| | Material of Base Material | Materiel of Insert Material | Mg Content of Insert Material (% by mass) | Bonding Strength (kgf/mm²) |
|---|---|---|---|---|
| Example 1 | Cu—Ni—Si Alloy | Mg-Containing Al alloy | 4.0~4.9 | 13.7 |
| Example 2 | Cu—Ni—Si Alloy | Mg-Containing Al alloy | 2.2~2.8 | 9.5 |
| Example 3 | Cu—Ni—Si Alloy | Mg-Containing Al alloy | 4.0~4.9 | 14.9 |
| Comparative Example 1 | Cu—Ni—Si Alloy | Pure Al | 0.0 | 4.9 |
| Comparative Example 2 | Cu—Ni—Si Alloy | Cu-Containing Al alloy | 0.4-0.8 | 6.7 |

It is found from the results of the bonding strength test as shown in Table 1 that each of the sputtering targets according to Examples 1 to 3 had higher bonding strength between the insert material and the base material. On the other hand, each of the sputtering targets according to Comparative Examples 1 and 2 had a lower bonding strength than that of each of the sputtering targets according to Examples 1 to 3.

Also, the comparison of Examples 1 to 3 reveals that the bonding strength increases by increasing the Mg content of the insert material.

As described above, it was found that the first member and the second member can be firmly bonded to each other by forming the Mg-containing layer containing Al, Cu and Mg and containing 5.0 at % or more of Mg in at least a part of the alloy layer between the first member and the second member such as the insert material and the base material.

DESCRIPTION OF REFERENCE NUMERALS 1 sputtering target
Ps sample collecting position

The invention claimed is:
1. A sputtering target comprising a plurality of members including a target material and a base material,
wherein the plurality of members comprise a first member and a second member laminated to each other, wherein the first member comprises Al, and the second member comprises Cu, wherein at least one of the first member and the second member comprises Mg, wherein the sputtering target comprises an alloy layer containing Al and Cu between the first member and the second member, the alloy layer being in contact with the first member and the second member, and wherein the alloy layer further comprises an Mg-containing layer containing 5.0 at % or more of Mg in at least a part of the alloy layer.

2. The sputtering target according to claim 1, wherein the sputtering target further comprises an insert material, and the target material, the insert material and the base material are laminated in this order, and wherein the first member is one of the insert material and the base material, and the second member is the other of the insert material and the base material.

3. The sputtering target according to claim 2, wherein the first member is the insert material and the second member is the base material.

4. The sputtering target according to claim 1, wherein a bonding strength of the first member and the second member is 5 kgf/mm$^2$ or more.

5. The sputtering target according to claim 1, wherein the target material contains Ti.

6. The sputtering target according to claim 1, wherein the alloy layer and the Mg-containing layer are formed by diffusion bonding of the first member and the second member.

7. The sputtering target according to claim 1, wherein the alloy layer has a lower Al content in a portion in contact with the second member than in a portion in contact with the first member.

8. The sputtering target according to claim 1, wherein the alloy layer has a lower Cu content in a portion in contact with the first member than in a portion in contact with the second member.

9. The sputtering target according to claim 1, wherein a thickness of the Mg-containing layer is 20% or more of a thickness of the alloy layer when SEM-EDX LineScan is performed along a thickness direction of the sputtering target.

10. The sputtering target according to claim 1, wherein, when observing a cross section along a thickness direction through a center of the sputtering target in a plane view, the Mg-containing layer is formed at a percentage of 50% or more of the entire width of the first member and the second member along a direction orthogonal to the thickness direction.

11. A method for producing a sputtering target according to claim 1, the method comprising:
    a preparation step of preparing the plurality of members, the plurality of members comprising a first member and a second member laminated to each other, the first member comprising Al and the second member comprising Cu, and at least one of the first member and the second member comprising Mg; and
    a bonding step of bonding the plurality of members comprising the first member and the second member under pressure while laminating the plurality of members.

12. The method for producing a sputtering target according to claim 11,
    wherein the bonding step is performed by hot isostatic pressing.

13. The method for producing a sputtering target according to claim 11, wherein the sputtering target further comprises an insert material, and the target material, the insert material and the base material are laminated in this order, and
    wherein the target material, the insert material and the base material are prepared in the preparation step, the first member is one of the insert material and the base material, and the second member is the other of the insert material and the base material.

14. The method for producing a sputtering target according to claim 13, wherein the first member is the insert material and the second member is the base material, and the first member and the second member are prepared in the preparation step.

15. The method for producing a sputtering target according to claim 11, wherein the target material contains Ti.

16. The method for producing a sputtering target according to claim 11, wherein in the bonding step, the first member and the second member are bonded together by diffusion bonding.

* * * * *